(12) United States Patent
Sudarshan et al.

(10) Patent No.: US 7,061,021 B2
(45) Date of Patent: Jun. 13, 2006

(54) SYSTEM AND METHOD FOR FABRICATING DIODES

(75) Inventors: Tangali S. Sudarshan, Columbia, SC (US); Stanislav Soloviev, West Columbia, SC (US); Ying Gao, West Columbia, SC (US)

(73) Assignee: The University of South Carolina, Columbia, SC (US)

( * ) Notice: Subject to any disclaimer, the term of this patent is extended or adjusted under 35 U.S.C. 154(b) by 0 days.

(21) Appl. No.: 10/837,862

(22) Filed: May 3, 2004

(65) Prior Publication Data

US 2004/0217457 A1    Nov. 4, 2004

Related U.S. Application Data

(60) Provisional application No. 60/519,248, filed on Nov. 12, 2003, provisional application No. 60/466,961, filed on May 1, 2003.

(51) Int. Cl.
  *H01L 31/0312*    (2006.01)
(52) U.S. Cl. .......................................... 257/77; 438/931
(58) Field of Classification Search .................. 257/77, 257/E21.054
  See application file for complete search history.

(56) References Cited

U.S. PATENT DOCUMENTS

| | | | |
|---|---|---|---|
| 5,705,406 A | | 1/1998 | Rottner et al. |
| 5,801,836 A | | 9/1998 | Bakowski et al. |
| 5,831,287 A | | 11/1998 | Bakowski et al. |
| 5,932,894 A | | 8/1999 | Bakowski et al. |
| 6,083,814 A | | 7/2000 | Nilsson |
| 6,100,111 A | | 8/2000 | Konstantinov |
| 6,670,688 B1 | * | 12/2003 | Satoh et al. ................. 257/484 |
| 2002/0019117 A1 | * | 2/2002 | Nagasawa ................... 438/505 |

FOREIGN PATENT DOCUMENTS

SE    9800960    3/1998

* cited by examiner

*Primary Examiner*—W. David Coleman
(74) *Attorney, Agent, or Firm*—McNair Law Firm, P.A.

(57) ABSTRACT

This invention is directed to a system and method of fabricating PN and PiN diodes by diffusing an acceptor impurity into a substrate. This invention is particularly advantageous for fabricating SiC diodes having linearly graded, deep pn junctions. One method that this invention uses to achieve its advantages is by diffusing an acceptor impurity into a substrate using a crucible, acceptor source, substrate, and furnace.

14 Claims, 12 Drawing Sheets

SYSTEM AND METHOD FOR FABRICATING DIODES

CROSS-REFERENCE TO RELATED APPLICATION

This application claims priority on provisional patent application No. 60/519,248, entitled A Method For Eliminating Forward Voltage Drift in Diodes, filed Nov. 12, 2003, and provisional patent application No. 60/466,961, entitled A Method For Eliminating Forward Voltage Drift in Diodes, filed May 1, 2003.

FIELD OF THE INVENTION

This invention is directed to a system and method for fabricating diodes and particularly to a system and method for fabricating a SiC diode.

BACKGROUND OF THE INVENTION

Silicon Carbide (SiC) has been recognized as the next generation semiconductor material to replace Si for high power and high frequency applications, particularly, under extreme conditions, such as high temperature and high radiation (e.g. in the space and nuclear reactors). In order to be used in industrial or military applications, the stability and reliability of the SiC diodes must be improved. However, the current technology of SiC PiN and PN diodes consistently exhibit a degraded forward voltage drop under constant forward current density during use. Failure rates in the fabrication of SiC diodes have been reported as high as 80%. This disadvantage of the present state of the art of SiC diodes has prevented their commercialization.

The disadvantages of SiC semiconductors is primarily related to material defects, particularly in the epitaxial layer of SiC diodes. Such defects behave as a deep energy level that traps carriers in the drift region of the diode, thereby reducing the carrier lifetime and increasing the forward voltage drop. Therefore, significant efforts to improve SiC material quality to reduce the defect density to a sufficient level to fabricate diodes without degradation is much needed.

The main obstacle in the fabrication of high power SiC PN and PiN junction diodes is the existence of defects that cause forward voltage drop degradation with time (voltage drift). This disadvantage is observed in diodes formed by both ion implantation and epitaxial growth. It is desirable to have the forward voltage drop to be as low as possible to reduce the on-state resistance of a diode. In addition, any voltage drop must be stable throughout the operating time of the diode. The initiation of diode degradation is associated with the generation and movement of structural defects such as stacking faults (SFs), in the active region of the diode. Stacking faults prevent the realization of long-term reliable SiC diodes. Thus far, no system or method for eliminating forward voltage drift in SiC diodes that have low forward voltage drops has been provided.

Degradation of forward voltage drop in SiC diodes destroys the usability of diodes. Referring now to Graph 1, the top curve represents incorrect performance of a SiC diode when forward voltage is applied to the diode. As the top curve shows, the forward voltage of the diode drops over time and degrades from approximately three volts to approximately 13 volts after approximately 1,500 seconds. Such quick failure has prevented the wide-spread commercialization of SiC diodes. However, SiC diodes that are produced by the invention described herein results in little to no degradation as shown in the lower curve of Graph 1. The voltage applied to produce a predetermined current of a SiC diode of this invention remains constant with little to no degradation.

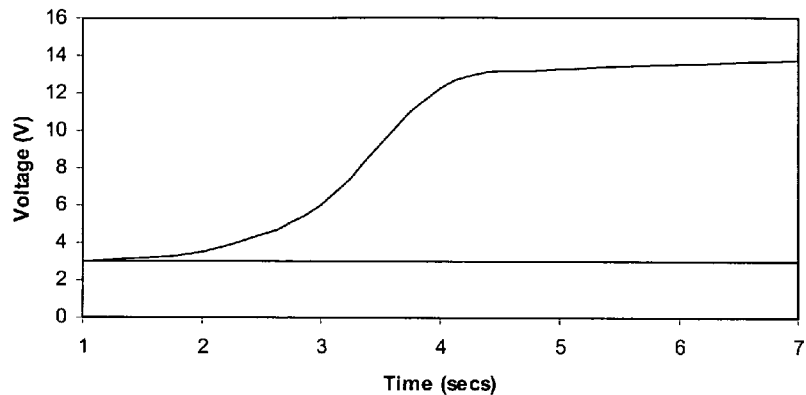
Graph 1

A principal reason for the generation of SFs in SiC diodes is the existence of stress in the crystalline lattice. Introduction of impurity atoms into a crystalline lattice causes mismatch stresses; atoms with smaller radii induce compressive strain while atoms with larger radii induce tensile strain. For proper operation of a device, the maximum concentration of dopant atoms at the contact ends (p+ or n+) must be high enough such as with a density greater than $10^{18}$ $cm^{-3}$. However, an increase in the doping concentration can result in increase of mismatch stresses. If the mismatch stresses exceed the value of critical shear stress, crystal lattice defects such as dislocations are formed. The formed dislocations act as nucleation sites for the generation of stacking faults, and can be responsible for the degradation of SiC diode and result in disadvantageous forward current-voltage characteristics. In order to eliminate the degradation, it is necessary to reduce mismatch stresses that result in the formation of dislocations.

Conventional methods, such as ion implantation and epitaxial growth used to form PN junctions in SiC devices, generally, result in the formation of abrupt PIN junctions. High impurity concentration gradients in these types of junctions induce lattice stresses due to different radii of dopant and host atoms. If the value of the stresses exceeds the yield stress (~1 MPa for SiC), mismatch dislocations might be generated. During the diode operation, the residual stresses may generate additional electrically active broken chemical bonds. These broken bonds can be carrier traps, which might result in an increase of the series resistance during PiN diode operation and, hence, in forward voltage drop increase.

Therefore, it is an object of this invention to provide a diode that does not have forward voltage drop degradation.

It is another object of this invention to provide a SiC diode that does not have forward voltage drop degradation.

SUMMARY OF THE INVENTION

The above objectives are accomplished by providing a method for fabricating a diode comprising the steps of providing a crucible; providing a substrate comprised of wide band gap material having at least one epitaxial layer within the crucible; providing an acceptor impurity in a gaseous state within the crucible; and, heating the crucible to at least 1400° C. for at least 60 seconds so that the acceptor diffuses into the substrate to create a p layer thereby producing a PiN diode. Alternatively, a substrate can be provided comprised of wide band gap material having a $n^+$ layer, a n– layer and a $p^+$ layer within the crucible.

In a preferred embodiment, the method further includes the steps of providing a substrate doped by donor impurities with a density of at least $10^{17}$ $cm^{-3}$. Preferably, providing a substrate doped with an n-type epitaxial layer with a density less than $10^{17}$ $cm^{-3}$. Alternatively, the method includes the step of providing a substrate with a p-type layer. In a preferred embodiment, the step of providing a substrate includes the step of providing a SiC substrate.

The method further includes the steps of forming a photoresistant layer on the substrate; and, heating the photoresistant layer in a vacuum to at least 400° C. at a rate of 2000° C. per hour or less so that the heating forms a carbon film thereby providing a protection layer on the substrate. Preferably, the photoresist layer is heated in a vacuum of pressure equal or below 1 Torr.

Preferably, the method includes the step of providing Aluminum in a gaseous state within the crucible.

In a preferred embodiment, the step of providing an acceptor impurity in a gaseous state includes the step of providing Boron in a gaseous state. This step preferably further includes providing an acceptor impurity in a gaseous state which includes the steps of providing source material having Boron; and, evacuating the crucible to a pressure less than or equal to 1 Torr. Additionally, it is preferred that the step of providing source material includes the step of providing SiC powder having at least 0.01% Boron by weight.

In a preferred embodiment, the method includes the step of purifying the crucible prior to providing an acceptor impurity in a gaseous state by flushing the crucible with an inert gas.

Advantageously, the method includes the step of removing a thickness of approximately 5–10 microns from the back side diffused layer of the diode. Additionally, it is preferred that the method include the step of forming mesa structures on the substrate so that a PiN diode is formed.

In a preferred embodiment, the method includes the step of forming a local mask on the substrate so that local diffusion can be performed. Advantageously, the step of forming a local mask includes the steps of forming a local photoresist pattern having a thickness of more than 2 microns; heating the photoresist pattern to at least 200° C. at a rate of 400° C. per hour or less to provide a hard-baked photoresist; and, heating the hard-baked photoresist in a vacuum at a pressure equal to or below 1 Torr to at least 600° C. at a rate of 400° C. per hour or less.

In a further advantageous embodiment, the method includes the steps of evacuating the crucible to a pressure of 760 Torr or less; and, inserting an inert gas into the crucible prior to heating the crucible to at least 1400° C. Accordingly, a diode is produced by the method this method.

The above objectives are further accomplished according to the present invention by providing a system for fabricating diodes that comprises a housing; a crucible contained within the housing; a heating member for heating the crucible; a substrate contained within the crucible having donor impurities with a density of at least $10^{17}$ $cm^{-3}$ and a n-type epitaxial layer with a density of less than or equal to $10^{17}$ $cm^{-3}$; and, a gaseous acceptor impurity source contained within the crucible so that when the crucible is heated, the acceptor diffuses into the substrate to form a PiN diode.

Preferably, the system includes a gaseous Aluminum source contained within the crucible so that the Aluminum diffuses into the substrate when heated. In another embodiment, the system includes an inert gas contained within the crucible.

In a preferred embodiment, the substrate is a SiC substrate and a graphite mask is included in the system for local diffusion having a thickness of at least one micron.

Preferably, the system includes insulation material generally surrounding the crucible and the acceptor impurity includes Boron. Advantageously, the gaseous acceptor impurity source includes at least 0.01% Boron by weight. In a further embodiment, the gaseous acceptor impurity source includes SiC powder.

The above objectives are further accomplished according to the present invention by providing a silicon carbide semiconductor comprising a $n^+$ layer; a $n^-$ layer carried by the $n^+$ layer; a p-layer carried by the $n^-$ layer having a graded pn junction between the $n^-$ layer and the p-layer where the gradient is at least $10^{23}/cm^4$. Preferably, the pn junction is located at least 0.5 micron from the top surface of the p layer.

Advantageously, the semiconductor may be formed by the process of ion implantation, or alternatively of epitaxial growth.

DESCRIPTION OF THE DRAWINGS

The invention is described through reference to the following drawings incorporated herein.

DETAILED DESCRIPTION OF A PREFERRED EMBODIMENT

Figure 1:
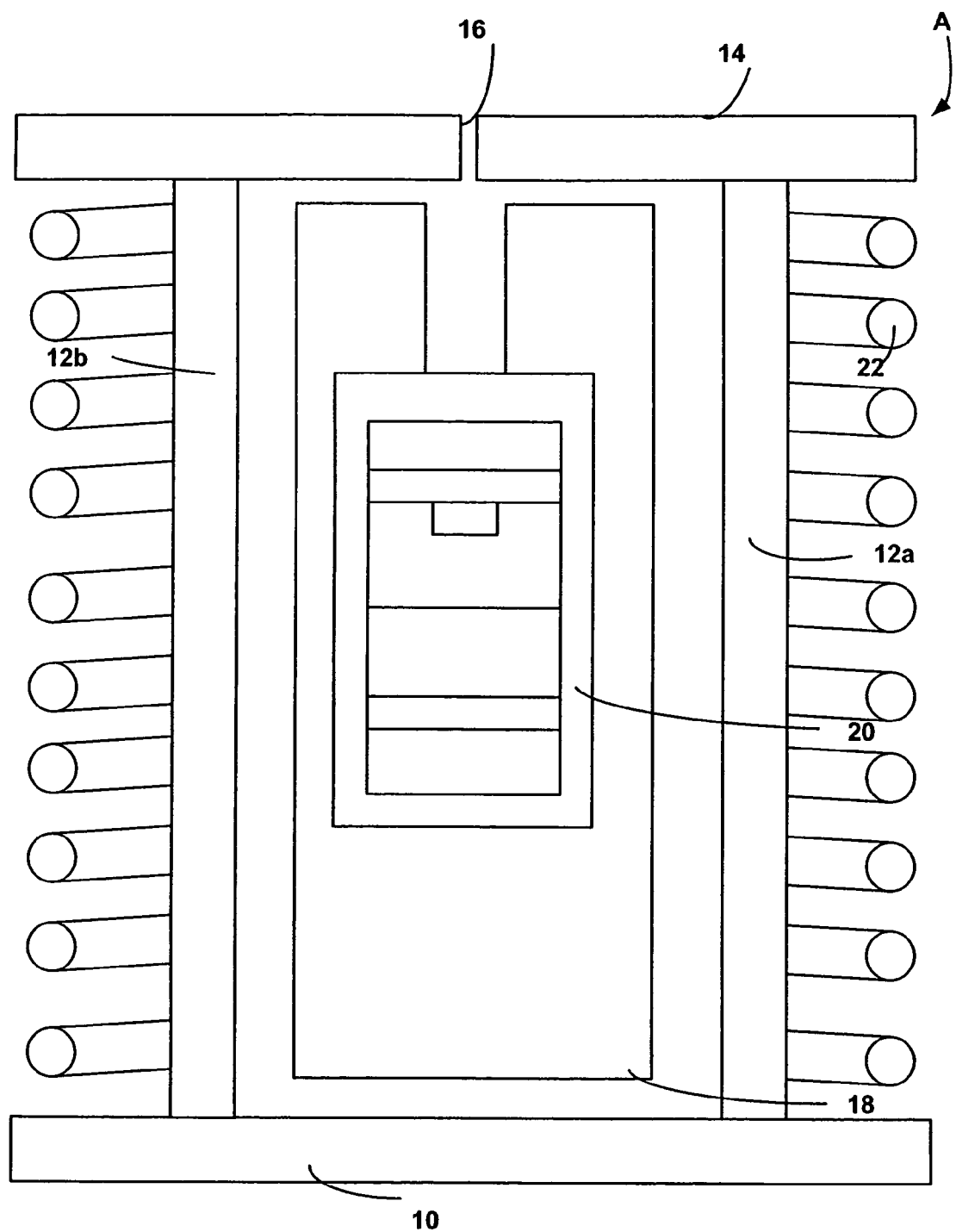
FIG. 1 is a schematic of the invention.

This invention is a novel system and method for PN and PiN diode fabrication, that results in operation of the diodes without voltage drift. This new process involves the formation of a graded, deep pn junction resulting from diffusion of acceptor impurity into a substrate, particularly a SiC substrate. It is advantageous to form a deep and graded doping concentration profile in the pn junction region to avoid the degradation of forward voltage drop. Deep pn junctions are advantageous to make sure that the pn junction is of sufficient distance from the near-surface p+ region to prevent adverse effects from any generation of structural defects. For example, when the p+ layer is Aluminum-doped, the effect of generated defects on the diode performance is not significant since the pn junction is located much deeper than the $p^+Al$ surface layer.

By using diffusion, an acceptor impurity atom, such as Boron, penetrates much deeper into the substrate and forms a graded concentration profile in the pn junction region. It has been discovered by the Inventors herein that a deep and graded doping concentration profile in the pn junction region reduces or eliminates degradation of forward voltage drop. Having a graded concentration profile prevents lattice stress that result in structural defects responsible for diode degradation. Even when the generation of defects occurs in heavily doped regions due to mismatch and/or other kinds of stresses, the effect of these defects on the operation of the pn junction where the doping concentrations are less than $\sim 10^{16}$ $cm^{-3}$ would be negligible due to the existence of the graded concentration profile.

The invention has been described with reference to a preferred embodiment and alternatives thereof. It is believed that modifications and alterations to the embodiment as discussed will readily suggest themselves to those skilled in the art upon reading and understanding the detailed description herein. The description herein is intended to include all such modifications and alterations insofar as they are within the scope of the present invention.

One method to reduce mismatch stresses to reduce defects is to compensate tensile strain by compressive strain or vice versa. This can be implemented by simultaneous introduction of two kinds of impurity atoms: one with smaller radii than those of the host atoms such as Si and C and the other with larger radii than those of the host atoms. For instance, in order to form pn and/or $p^+p^-$ junctions, impurity atoms can be Al, B, and Be, which are acceptors in SiC The radius of the Al atom is greater than that of host atoms Si and C, while radii of B and Be are smaller than Si but greater than C. Thus, co-incorporation of such combinations as Al/B, Al/Be or Al/B/Be can result in reduction of mismatch stresses and, hence, eliminate the formation of defects responsible for diode degradation.

In order to form $n^+n^-$ and/or np junctions, examples of impurity atoms include N, P, As, and Sb for donors. A nitrogen atom is smaller than C or Si atoms, while, the phosphorous radius is smaller than Si but greater than that of C atoms and As or Sb atoms are greater than Si or C atoms. Thus, co-incorporation of N with atoms of P, As, or Sb can reduce mismatch stresses in the pn regions and, hence, eliminate the formation of defects responsible for diode degradation.

To further reduce induced stresses, so-called neutral atoms, neither acceptors nor donors in SiC, can be incorporated into doped regions in order to minimize or eliminate defect generation.

Another method to reduce stresses due to doping SiC is to form graded dopant atom concentration profiles during the formation of the pn or $p^+p^-$ junctions. Referring to Graph 2 through 4, dopant profiles illustrating several concentration distributions showing the p-region, the n-region, or the combination of p- and n- regions forming a diode are provided. The diode formulations include $p^+$-p(graded)-$n^+$, $p^+$-p-n(graded)-$n^+$, $p^+$-p(graded)-n(graded)-$n^+$, and $p^+$-n (graded)-$n^+$, by having SiC diodes with a gradated concentration profile, mismatch stresses are reduced and can eliminate the formation of defects responsible for diode degradation. The graded profile can be formed at either one junction or both the junctions: pn, $p^+p^-$, $n^+n^-$, or np. The graded dopant atom concentration profile can be formed by different techniques such as diffusion, ion implantation, epitaxial growth, or others. The processes of producing semiconductors through ion implantation or epitaxial growth are known to those skilled in the art.

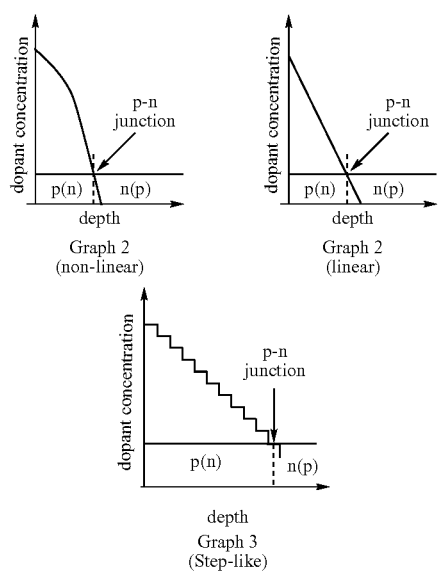

Graph 2 (non-linear)

Graph 2 (linear)

Graph 3 (Step-like)

Further, formation of the graded profiles results in formation of "deep" p-n junctions that are located some distance from the heavily doped end regions.

Referring now to FIG. 1, the system for fabricating diodes, particularly SiC PN and PiN diodes is illustrated. A housing, shown generally as A, is shown having a base 10, side walls 12a and 12b and top 14. Top 14 defines an opening 16 that can allow gas to flow from the interior of the housing as well as receive a pyrometer to determine the temperature of the interior. Insulating material 18 can be located within the housing and surrounding a crucible 20. Heating member 22 allows the crucible to be heated.

Figure 2A:
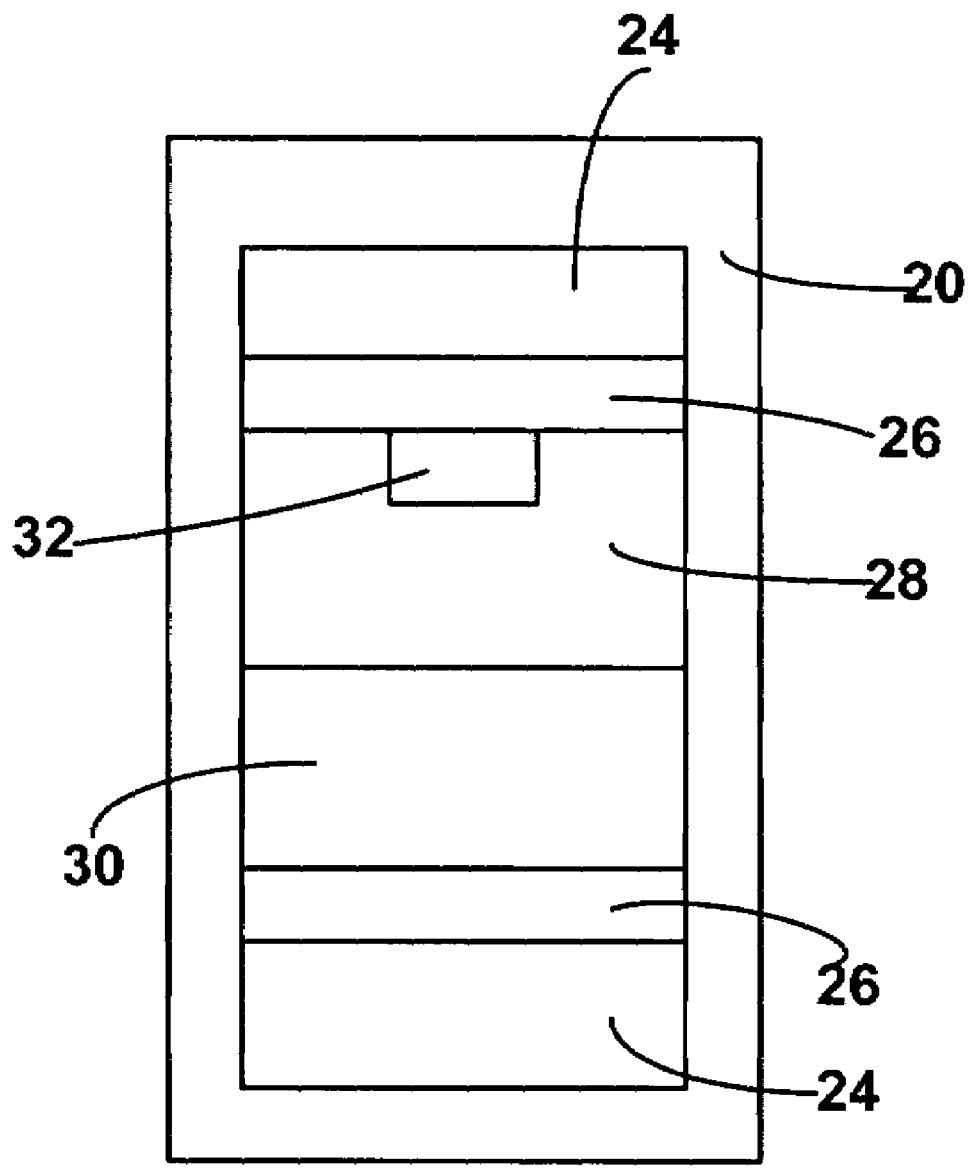
FIG. 2A is a schematic of the crucible.
Figure 2B:
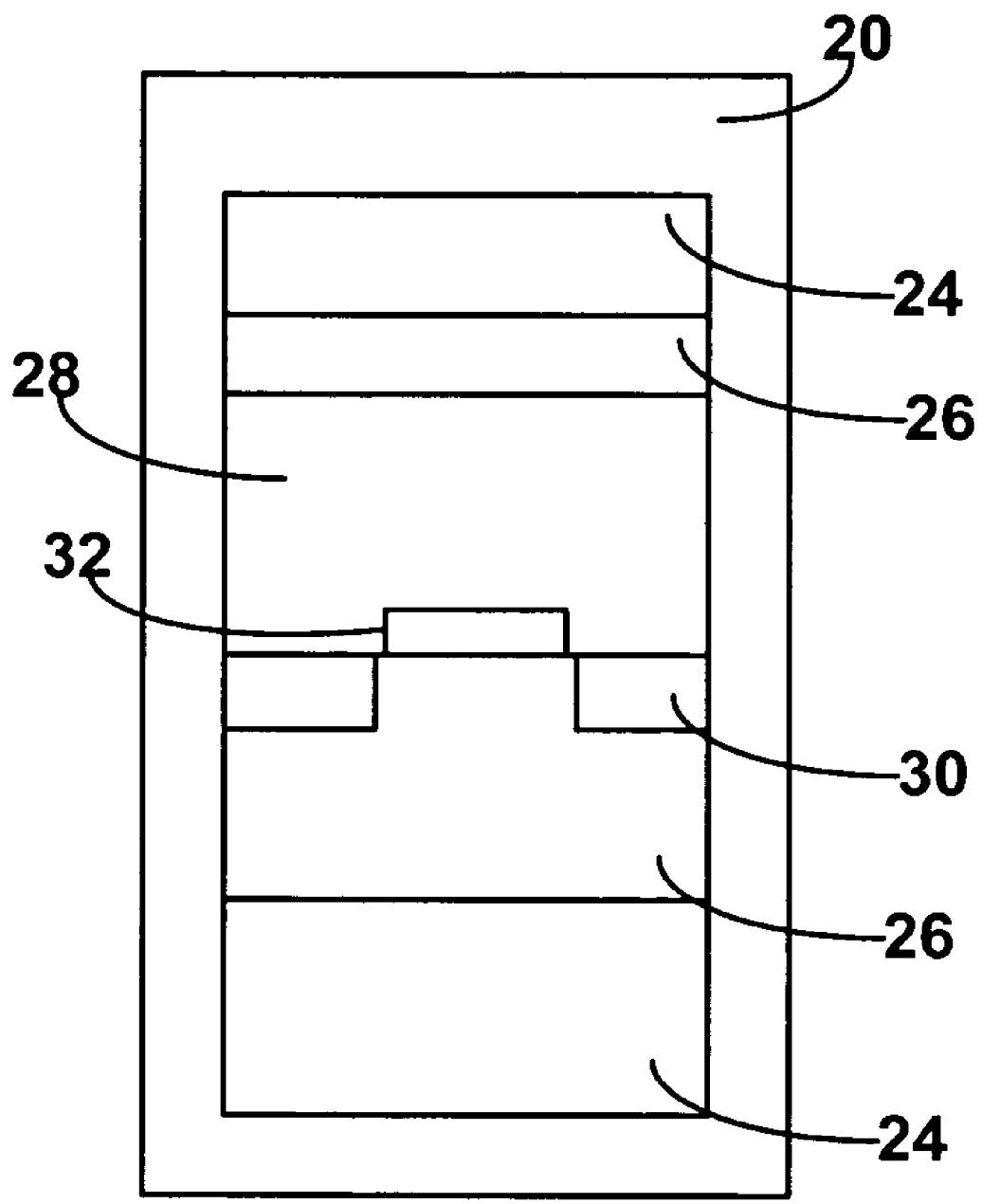
FIG. 2B is a schematic of the crucible.

Referring to FIG. 2A, the crucible is described in more detail. Crucible insulating material 24 can be included in the crucible. Graphic or SiC material 26 can be included within the crucible. A gaseous acceptor, such as Boron, can be inserted into space 28 through several means. Boron can be inserted in gaseous form using $BCl_3$ or $B_2H_6$ or TMB. Further, source material 30 can contain Boron that can be vaporized to provide gaseous Boron in space 28. FIG. 2B illustrates another configuration of the interior of the crucible. Under the proper pressure and temperature, gaseous Boron is diffused onto substrate 32 to form a SiC diode.

Figure 3A:
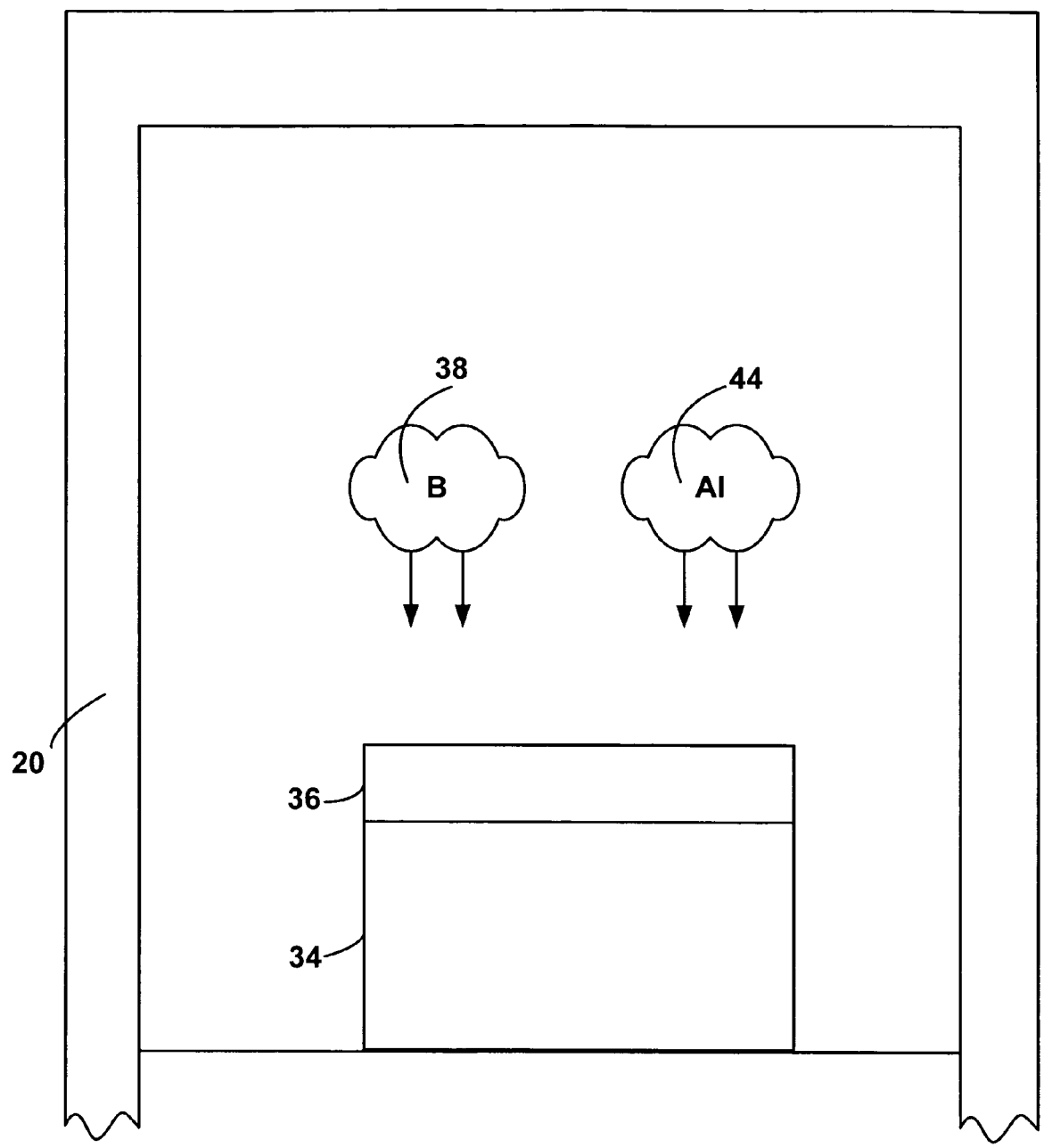
FIG. 3A is a schematic of a substrate.
Figure 3B:
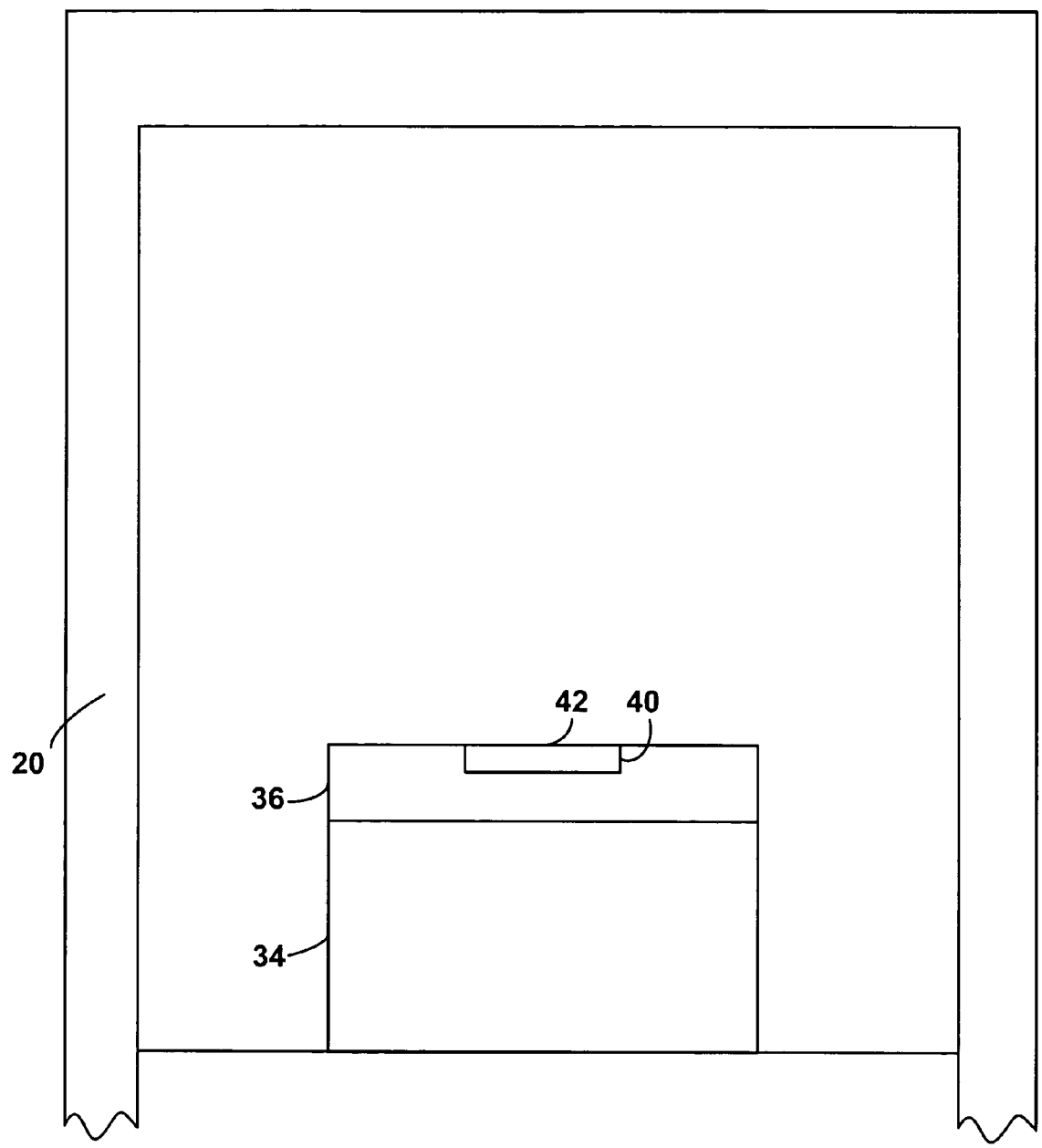
FIG. 3B is a schematic of a substrate.

Referring now to FIG. 3A, a substrate is shown having $n^+$ layer 34 and a $n^-$ or i layer 36, also termed the epitaxial layer. Gaseous Boron 38, under the proper pressure and temperature, will diffuse into the epitaxial layer to form a p-layer 42 (FIG. 3B) thereby forming a p/n junction 40. Additionally, aluminum 44 in gaseous form can be provided so that Aluminum also diffuses into epitaxial layer 36. Since the diffusion coefficient of Aluminum is much less than that of Boron, Aluminum will not diffuse as deep into the epitaxial layer to allow a more conductive surface in $p^+$-layer 42. Generally, the aluminum will diffuse shallower on the substrate than Boron.

Figure 4A:
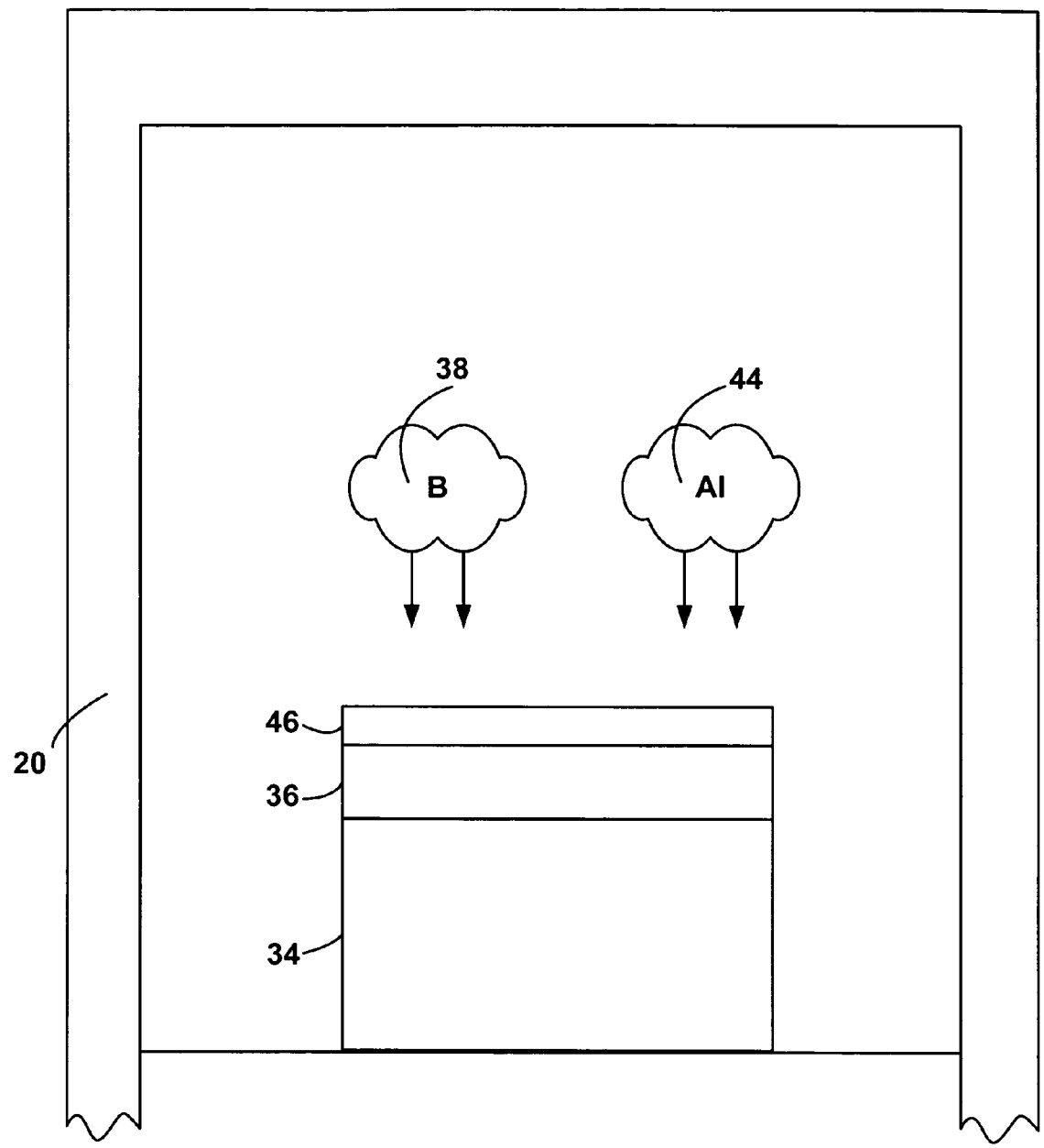
FIG. 4A is a schematic of a substrate.
Figure 4B:
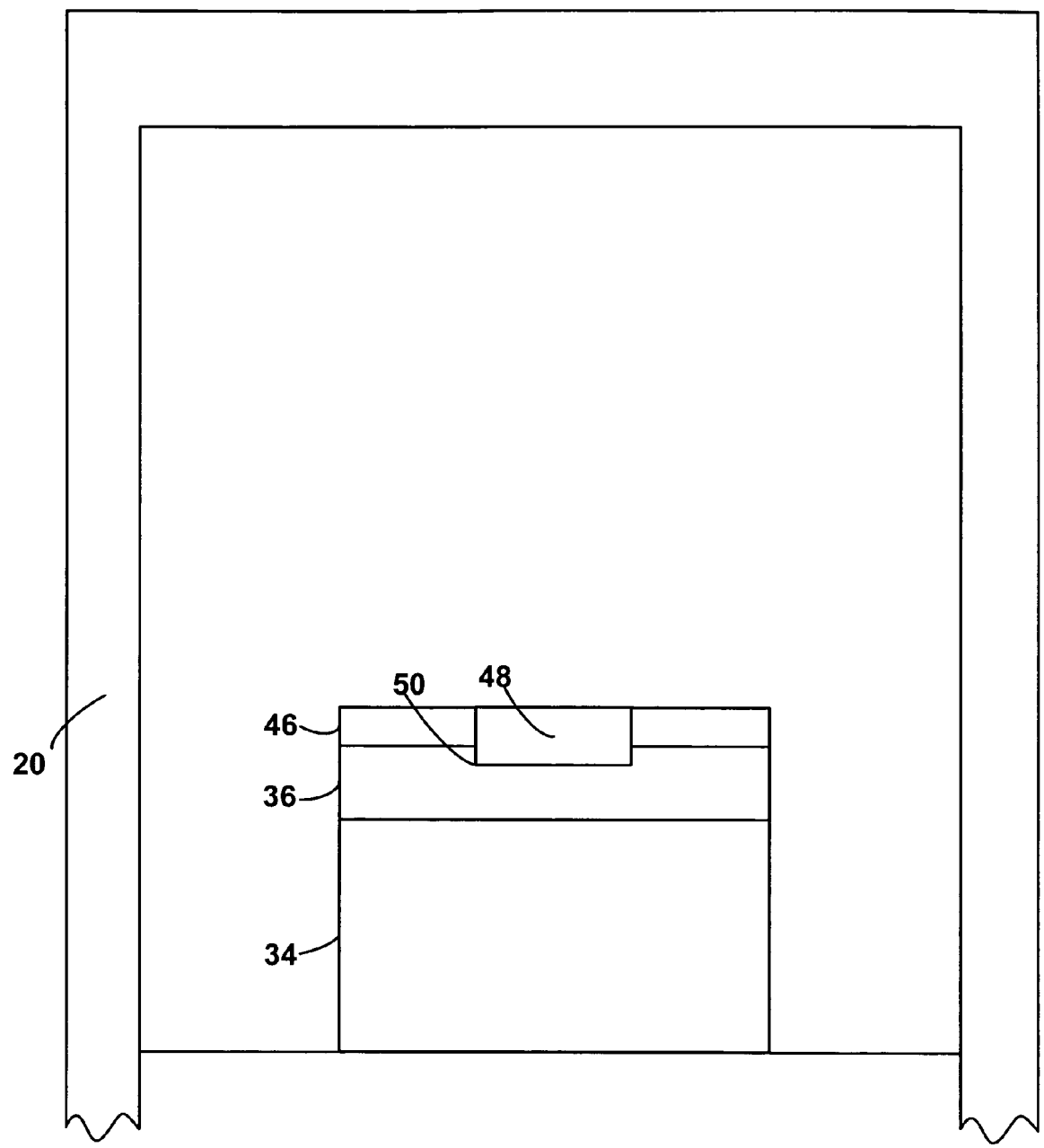
FIG. 4B is a schematic of a substrate.

Referring now to FIG. 4A, an alternative substrate is shown having $n^+$ layer 34, a $n^-$ or i layer 36, and a $p^+$ layer 48. With this substrate, Aluminum can be used to form the $p^+$-layer 46 so that enhanced conductivity is already present. Therefore, when the acceptor impurity, such as Boron, diffuses into the substrate, a $p^+$ layer 48 (FIG. 4B) is created deeper than $p^-$ layer 46 to form a diode. Therefore, pn junction 50 is formed to provide a diode.

Figure 5A:
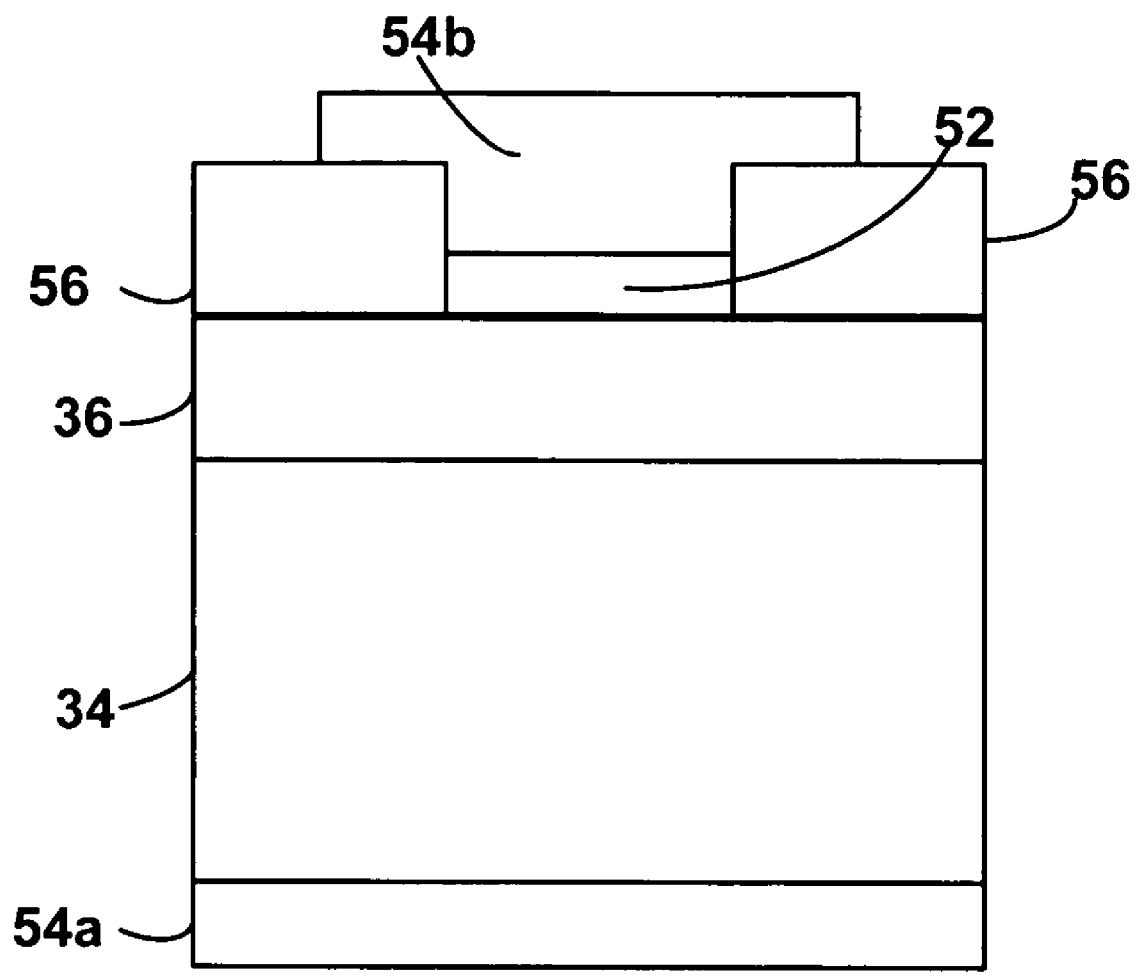
FIG. 5A is a schematic of a substrate.
Figure 5B:
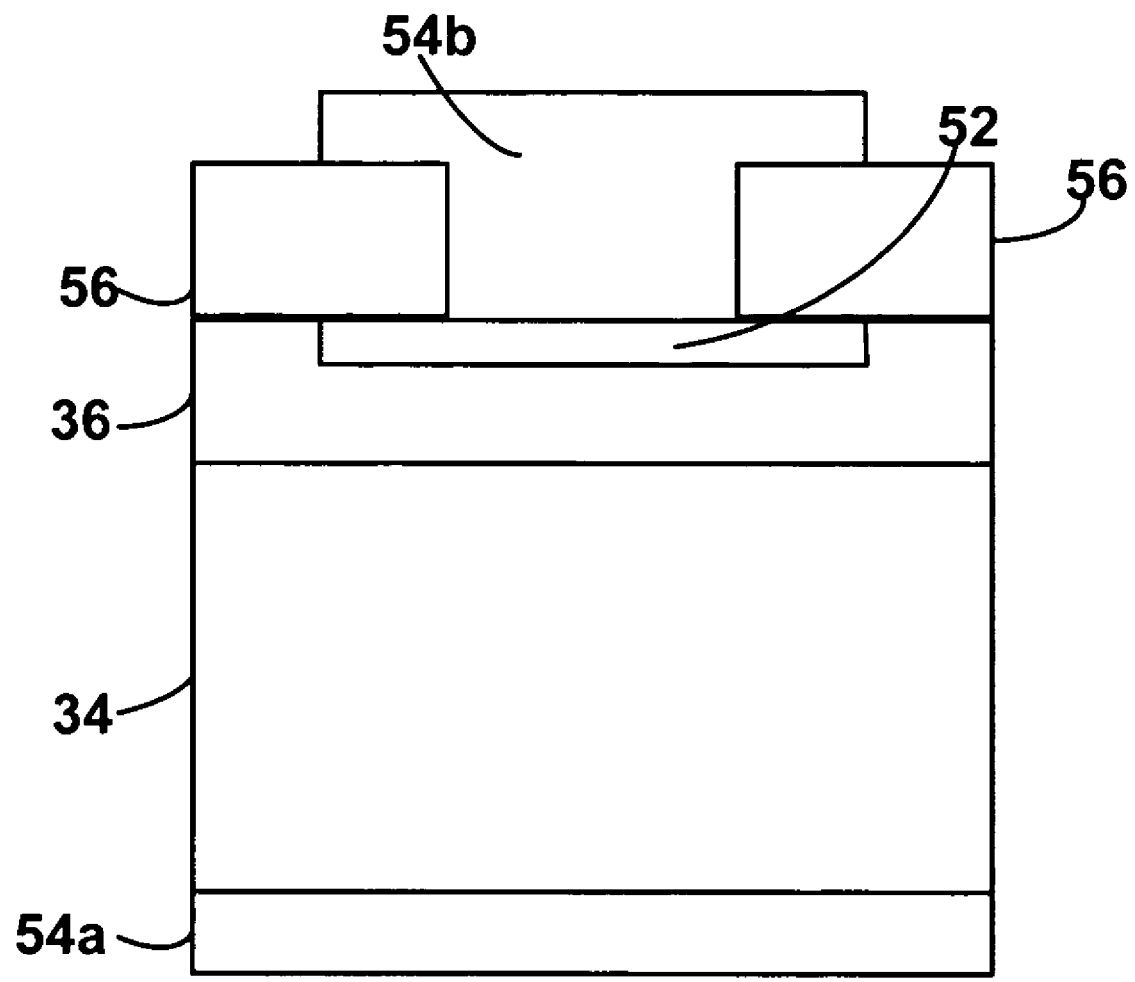
FIG. 5B is a schematic of a substrate.

Referring now to FIG. 5A, a completed mesa type diode is shown. $N^+$ layer 34 is shown with epitaxial layer 36 with p-layer 52, ohmic contacts 54a and 54b and edge passivation layer 56. FIG. 5B illustrates a planar type PiN diode having similar components.

As discovered by the Inventors, these diodes having linearly graded, deep pn junctions provides advantages by reducing or eliminating forward voltage drop in diodes, and particularly SiC diodes.

Figure 6:
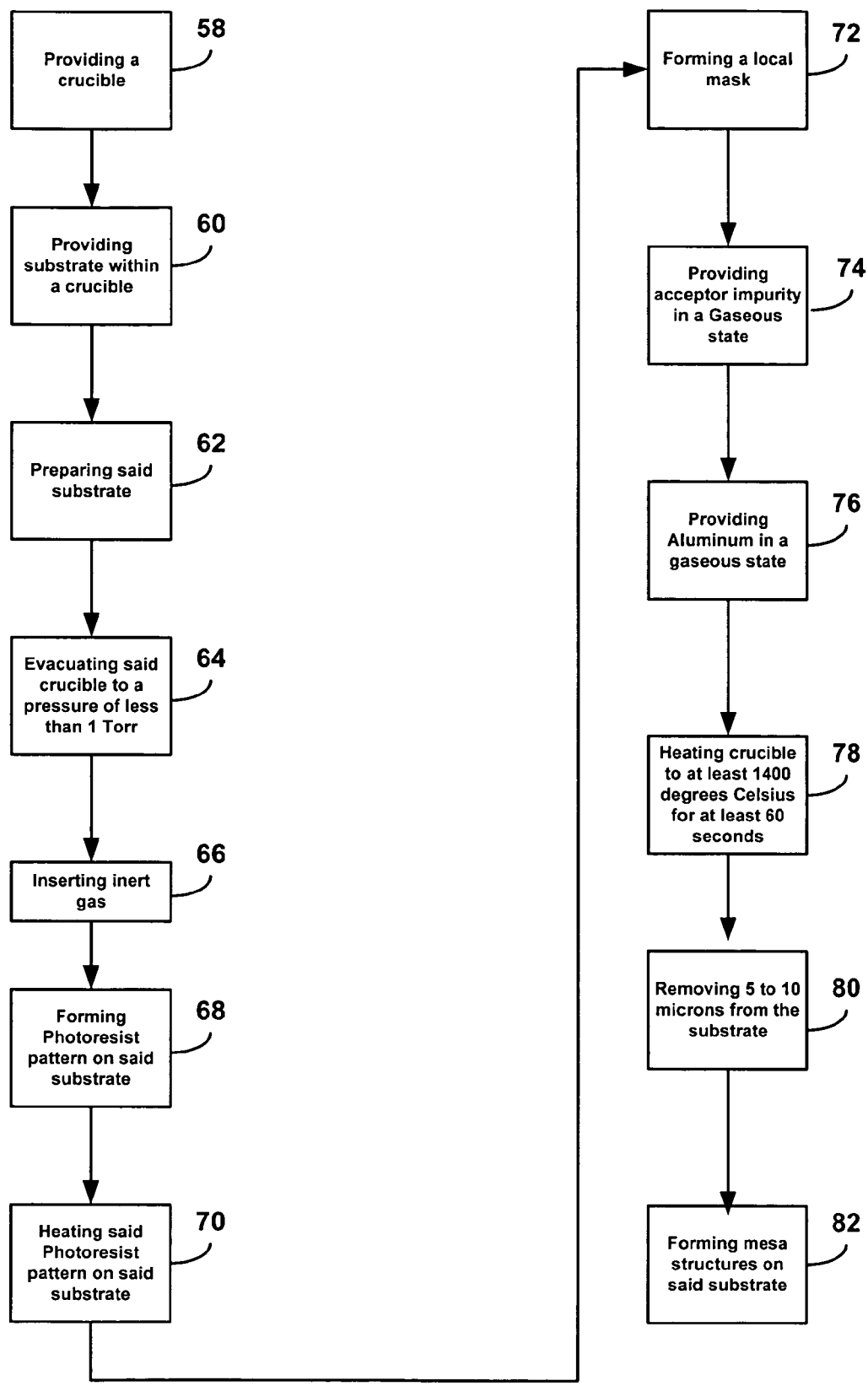
FIG. 6 is a flowchart of the invention.

Referring to FIG. 6, the method of this invention is described in more detail. In step 58, a crucible is provided. This crucible can be provided within a housing so as to be operably associated with a heating member and insulation. In step 60, a substrate is provided within the crucible. In the preferred embodiment, a SiC substrate, such as a 4H or 6H-SiC substrate is used. The substrate can be doped by donor impurities with a density of $10^{17}$ cm$^{-3}$ or higher. The substrate can be doped with an n-type epitaxial layer with a density of less than $10^{17}$ cm$^{-3}$. Crystallographic orientations of the substrate can be any of the possible orientations including (0001), (000–1), (11–20), (1–100) or (03–38). The actual thickness and doping concentrations of the epitaxial layer will be determined by the desired blocking voltage of the diode and determined by those skilled in the art. For example, the substrate should be more than twelve microns for a blocking voltage of more than 1000 volts.

In step 62, preparing the substrate is performed. This step is known in the art and can involve the standard RCA cleaning procedure. Further, the crucible can be purified at step 64 to prepare the crucible for the diffusion process. This step helps insure that no undesirable impurities are present during diffusion. To create an environment as free as possible from undesirable impurities that may adversely affect diffusion, the crucible can be evacuated to a pressure of less than 760 Torr. Further, an inert gas such as Argon can be injected at step 66.

Prior to diffusion, a protection layer can be added to prevent parasitic sublimation or undesirable epi-growth in the SiC substrate. The protective layer can be formed by graphitization of a photoresist layer deposited over the formed mask for local diffusion or the entire substrate for blanket diffusion as used for mesa diodes. To form the protective layer, a photoresist layer is formed on the substrate and heated to form the protective layer. This process is similar to that used to form the local mask for local diffusion.

Figure 7A:
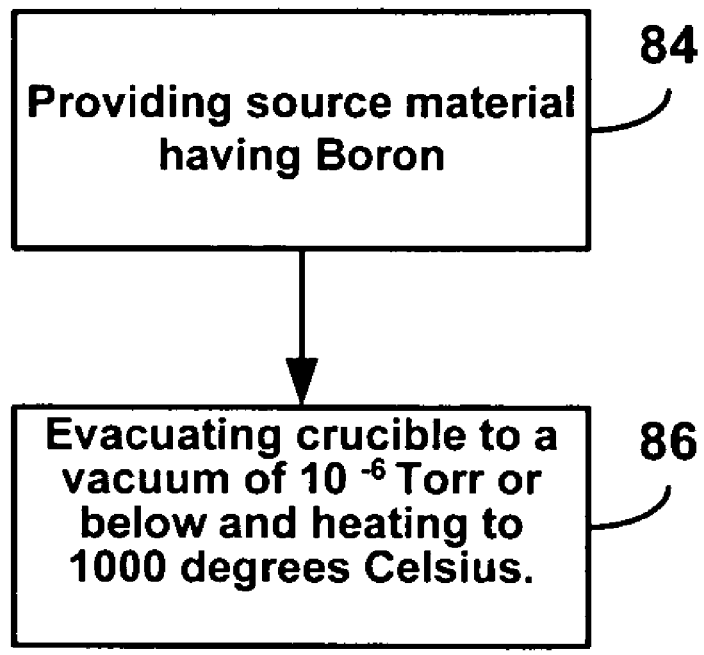
FIG. 7A is a flowchart of the invention; and,
FIG. 7B is a flowchart of the invention.
Figure 7B:
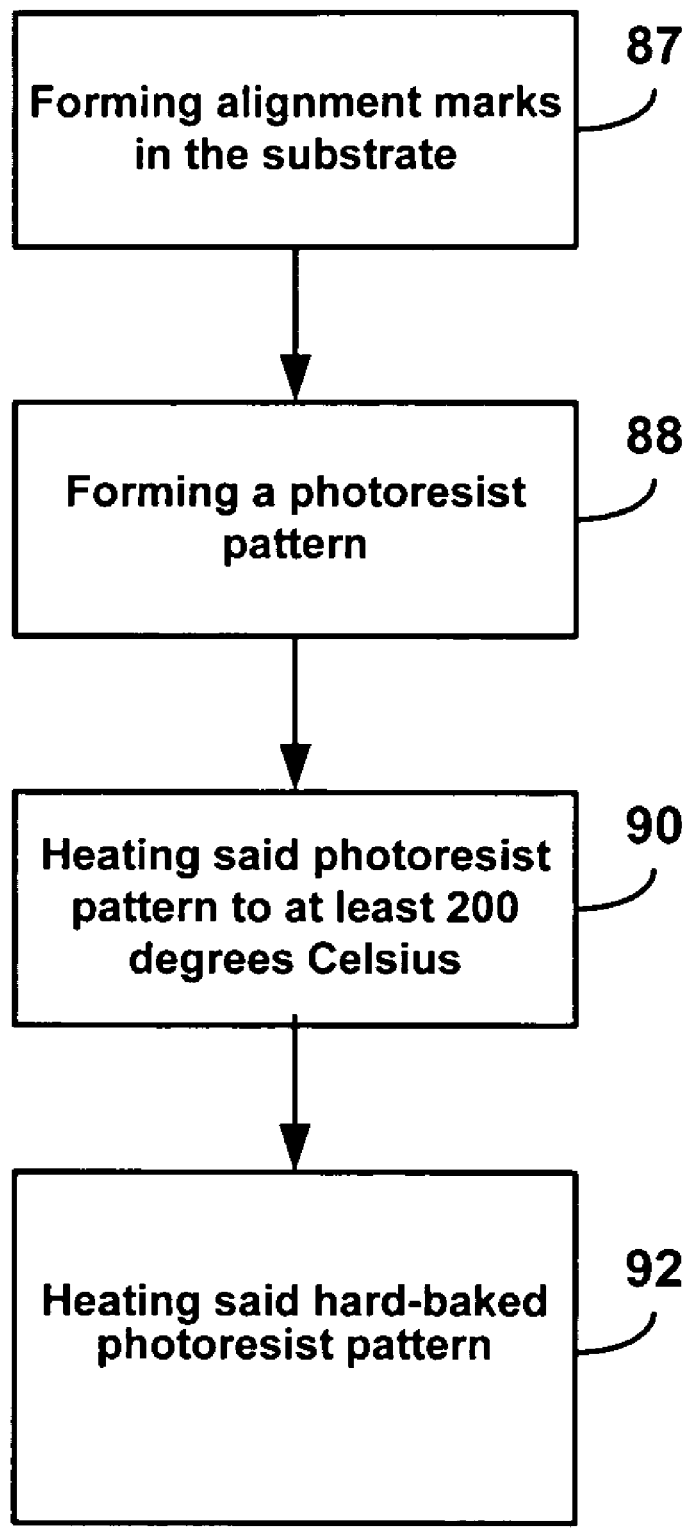

In the case where local diffusion is desired, such as in planar diodes, a photoresist pattern is formed on the substrate at step 68. The pattern is heated at step 70 to provide a local mask at step 72. Prior to forming the local mask, alignment marks can be formed in the substrate to facilitate post diffusion lithography at step 87 (FIG. 7B). Alignment marks can be formed by standard photolithography followed by dry etching, such as reactive ion etching.

In planar diodes, the photoresist pattern of the local mask can also be formed by photolithography at step 88 (FIG. 7B). Further, the photoresist layer can be hard-baked by heating the photoresist to at least 200° C. step 90, at a rate of 400° C. per hour or less in a clean room environment. Optionally, a soak process at the maximum temperature can be performed on the hard-baked photoresist. The hard-baked photoresist can then be graphitized by heating the photoresist at a pressure equal to or below 1 Torr to at least 600° C. at a rate of 400° C. per hour or less at step 92. After graphitization, the thickness of the formed carbon film should be at least three microns.

In step 74, the diffusion process begins by providing Boron in a gaseous state. Sources of Boron include TMB, $B_2H_6$, $BCl_3$ and SiC source material including 0.01% Boron by weight. Using a solid source material for Boron requires that the pressure and temperature within the crucible be sufficient to provide Boron in a gaseous state from the source material. Heating of the crucible can be through a heating member using inductive, resistive, or other heating method. Additionally, Aluminum can be added to the crucible in gaseous form to also be diffused into the substrate. This provides for a conductive layer carried by the p layer to increase conductivity of the diode. Aluminum can be added to the crucible at step 76.

Further, a graphite susceptor can be used to hold the substrate during the diffusion process. Once the substrate is mounted in the crucible and Boron is present at step 84, FIG. 7A), the crucible can be evacuated to a pressure 760 Torr or less at step 86 and heated to approximately 1000° C. for approximately ten minutes. The crucible can then be injected with high purity Argon and the pressure raised in the range 1 to 760 Torr. The temperature is then raised up to at least 1400° C. and held for at least sixty seconds so that the diffusion process can be performed resulting in a graded, deep pn junction of the diode. In one embodiment, control of the pressure and powder composition of the source material is maintained to reduce or eliminate reaction of the graphite mask with Aluminum vapor.

Source material can also include SiC powder with Aluminum concentrations for acceptor impurities in concentrations of 0.01% or less by weight, respectively. It is also possible to use doped SiC polycrystal or moncrystals as source material.

During the diffusion step, impurity atoms can diffuse into the back side of the substrate. Therefore, it may be necessary to remove a thickness of approximately 5 to 10 microns from the substrate at step 80. Further, the masks can be removed through oxidation at temperatures in excess of 500° C. or by oxygen plasma at room temperature.

If blanket diffusion is performed, the formation of mesa structures at step 82 form forms the diode. The formation of mesa structures is known in the art and can be performed by reactive ion etching using metals such as Ni or ITO or with dielectric masks.

To reduce surface leakage of the diode, the top surface can be covered by an insulation layer. Methods for providing the insulation layer include thermal oxidation, deposition of dielectric film by electronic beam, magnetron sputtering or plasma-enhanced chemical vapor deposition. Ohmic contacts can be formed through photolithography, metal deposition or contact annealing.

What is claimed is:

1. A silicon carbide semiconductor comprising:
   a $n^+$ layer;
   a $n^-$ layer carried by said $n^+$ layer;
   a p-layer carried by said $n^-$ layer having a graded pn junction between said $n^-$ layer and said p-layer where said gradient is at least $10^{23}/cm^4$; and,
   a substrate carried by said p layer and having an acceptor impurity density of at least $10^{17}$ $cm^{-3}$ formed by said acceptor impurity being diffused onto said substrate, said substrate having already been formed, when said acceptor impurity is in a gaseous state.

2. The semiconductor of claim 1 wherein said pn junction is located at least 0.1 micron from the top surface of said p layer.

3. The semiconductor of claim 1 having substrate doped with an n-type expitaxial layer having an impurity density of less than $10^{17}$ $cm^{-3}$.

4. The semiconductor of claim 1 including a carbon film carried by said substrate formed by heating a photoresist layer carried by said substrate to at least 200° C. at a rate of 2000° C. or less.

5. The semiconductor of claim 4 having a photoresist layer having a thickness of approximately 1–10 microns to be used to form a carbon film carried by said substrate by heating said photoresist layer to at least 200° C. at a rate of 2000° C. or less.

6. The semiconductor of claim 1 having a hard-baked photoresist layer having a thickness of at least 2 microns formed by heating a photoresist layer carried by said substrate to at least 200° C. at a rate of 400° C. per hour or less and re-heating said photoresist at a pressure equal to or below 1 Torr to at least 600° C. at a rate of 400° C. per hour or less.

7. The semiconductor of claim 1 wherein said substrate contains Aluminum formed by diffusing Aluminum in a gaseous state into said substrate by heating.

8. The semiconductor of claim 1 wherein said pn junction is located at least 0.01 micron from the top surface of said p layer.

9. A silicon carbide semiconductor comprising:
   a substrate having a donor impurity density of at least $10^{17}$ $cm^{-3}$;
   an epitaxial layer carried by said substrate having a n+ layer and a n− layer;
   a p layer in said epitaxial layer formed by doping said epitaxial layer with gaseous Boron created by heating a solid impurity source and heating said substrate to at least 200° C., after said substrate has been formed; and,
   a pn junction formed by said p layer in said epitaxial layer.

10. The semiconductor of claim 9 wherein said substrate contains Aluminum formed by diffusing gaseous Aluminum so that a conductive layer is carried by said p layer to increase conductivity.

11. The semiconductor of claim 9 including a carbon film carried by said substrate formed by heating a photoresist layer carried by said substrate to at least 200° C. at a rate of 2000° C. per hour or less.

12. The semiconductor of claim 9 having a first photoresist layer carried by said substrate which is converted to a second photoresist layer having a thickness of at least 2 microns formed by heating said first photoresist layer to at least 200° C. at a rate of 400° C. per hour or less and re-heating said first photoresist at a pressure equal to or below 1Torr to at least 600° C. at a rate of 400° C. per hour or less.

13. The semiconductor of claim 9 wherein said pn junction is located at least 0.01 micron from the top surface of said p layer.

14. A silicon carbide semiconductor comprising:
   a $n^+$ layer;
   a $n^-$ layer carried by said $n^+$ layer;
   a p-layer carried by said $n^-$ layer having a graded pn junction between said $n^-$ layer and said p-layer where said gradient is at least $10^{23}/cm^4$ wherein said pn junction is located at least 0.1 micron from the top surface of said p layer.

* * * * *